United States Patent [19]
Catalano et al.

[11] Patent Number: 4,667,058
[45] Date of Patent: May 19, 1987

[54] METHOD OF FABRICATING ELECTRICALLY ISOLATED PHOTOVOLTAIC MODULES ARRAYED ON A SUBSTRATE AND PRODUCT OBTAINED THEREBY

[75] Inventors: Anthony W. Catalano, Rushland, Pa.; Robert V. D'Aiello, East Brunswick, N.J.; John A. Brewer, Yardley; Richard J. Podlesny, Morrisville, both of Pa.

[73] Assignee: Solarex Corporation, Rockville, Md.

[21] Appl. No.: 750,776

[22] Filed: Jul. 1, 1985

[51] Int. Cl.$^4$ .................... H01L 27/14; H01L 31/18
[52] U.S. Cl. ........................ 136/244; 29/572; 29/583; 29/591; 156/643; 156/653; 156/657; 156/662; 136/258; 357/30; 219/121 LJ; 219/121 LN
[58] Field of Search ................... 29/572, 583, 591; 156/643, 649, 662, 663, 653, 657; 204/192 E; 136/244, 249 MS, 258 AM; 357/30, 45; 219/121 LJ, 121 LN

[56] References Cited
U.S. PATENT DOCUMENTS

4,518,815  5/1985  Yamazaki .......................... 136/244
4,594,471  6/1986  Yamazaki .......................... 136/249

OTHER PUBLICATIONS

S. Yamazaki et al, *Conference Record*, 17th IEEE Photovoltaic Specialists Conf. (1984), pp. 206–211.
Y. Tyan et al, *Conference Record*, 17th IEEE Photovoltaic Specialists Conf. (1984), pp. 961–964.

*Primary Examiner*—Aaron Weisstuch
*Attorney, Agent, or Firm*—Finnegan, Henderson, Farabow, Garrett & Dunner

[57] ABSTRACT

A method of fabricating electrically isolated photovoltaic modules arrayed on a substrate by forming overlying front contact strips, photovoltaic strips, and back contact strips on a flat transparent substrate, laser scribing between modules to electrically isolate adjacent modules for the simultaneous testing and electrical curing of the modules on a single substrate, and plasma etching the inter-module grooves formed by the laser isolation step to improve the percentage of modules on a single substrate that pass minimum performance criteria.

Also disclosed is an array of electrically isolated, thin-film semiconductor devices fabricated on a single substrate, wherein adjacent semiconductor devices are separated by laser-scribed grooves extending through the devices to the substrate and the walls of the grooves have been etched by plasma etching.

21 Claims, 5 Drawing Figures

METHOD OF FABRICATING ELECTRICALLY ISOLATED PHOTOVOLTAIC MODULES ARRAYED ON A SUBSTRATE AND PRODUCT OBTAINED THEREBY

BACKGROUND OF THE INVENTION

1. Field of the Invention

The present invention relates to a method of electrically separating adjacent thin-film semiconductor devices formed on a continuous substrate to enable testing and electrical curing of individual devices without breaking up the substrate. More particularly, the present invention relates to a method of fabricating improved quality electrically isolated photovoltaic modules arrayed on a continuous substrate.

2. Descrition of the Related Art

As is well known in the art, mass production of thin-film photovoltaic modules or other thin-film semiconductor devices yields products of varying quality in a single production run. To ensure the satisfaction of buyers of such mass-produced products, quality control measures such as testing the end products and discarding modules of low quality have been instituted.

Ideally, each module produced should be tested to ensure that only those meeting certain performance requirements are sold to the public and only those failing to meet the requirements are discarded. Conventionally, the testing of photovoltaic modules is done on a one by-one basis, irrespective of whether the modules are produced individually or as a batch fabricated simultaneously in an array on a single substrate. In the latter case, the substrate first is broken up into individual modules before testing.

Such testing procedures are expensive and time consuming. For photovoltaic modules that are fabricated in an array on a single substrate, it would be more economical to test the modules before breaking up the substrate. Testing done at this stage would eliminate problems of handling such large numbers of small components and, if all of the modules on a single substrate were tested simultaneously (or sequentially at high speed with the aid of a computer), would provide great savings in labor and other production costs. The simultaneous testing of a plurality of modules arrayed on a single substrate requires, however, that the individual modules be electrically isolated from each other so that the current and voltage produced by each individual module can be detected. Such electrically isolated modules also could be electrically cured, that is, repaired by being subjected to a reverse-bias current, and retested before the substrate is broken up.

The present invention is intended to provide an improved method of electrically isolating adjacent photovoltaic modules arrayed on a single substrate to enable the simultaneous testing and curing of each of the modules on the substrate.

The present invention also is intended to provide an improved method of electrically isolating adjacent photovoltaic modules arrayed on a single substrate without damaging the substrate and without damaging the individual modules in the array.

Additional advantages of the present invention will be set forth in part in the description that follows and in part will be obvious from that description or can be learned by practice of the invention. The advantages of the invention can be realized and obtained by the method particularly pointed out in the appended claims.

SUMMARY OF THE INVENTION

The present invention overcomes the problems of the prior art methods of testing mass-produced thin-film semiconductor devices by providing a method of removing recrystallized semiconductor material from the walls of laser-scribed grooves separating adjacent thin-film semiconductor devices formed in an array on a substrate. The method comprises the steps of covering the array with an etch resist while leaving the grooves exposed and etching the grooves with a plasma in a plasma chamber, the plasma reacting with and removing the recrystallized semiconductor material on the groove walls.

To overcome the problems of the prior art testing methods and in accordance with the purpose of the invention, as embodied and broadly described herein, the method of this invention of fabricating electrically isolated photovoltaic modules arrayed on a transparent substrate comprises the steps of: forming a thin front contact film of transparent conductive material on one side of the substrate; forming a thin film of photovoltaic material on top of the front contact film; forming a thin back contact film of conductive material on top of the photovoltaic film; performing a laser isolation step of forming inter-module grooves extending through the overlying front contact film, photovoltaic film, and back contact film with a laser to separate the overlying films into a plurality of electrically isolated photovoltaic modules without damaging the substrate; and etching the photovoltaic material exposed on the walls of the inter-module grooves after the laser isolation step.

Broadly, the present invention further includes a method of fabricating electrically isolated multi-cell photovoltaic modules arrayed on a transparent substrate, comprising the steps of: forming a film of transparent conductive oxide on the substrate; scribing the conductive oxide film with a laser to form a plurality of first grooves separating the conductive oxide film into a plurality of front contact strips; fabricating a film of photovoltaic amorphous silicon on the conductive oxide strips, the amorphous silicon filling the first grooves to electrically insulate adjacent front contact strips; scribing the amorphous silicon film with a laser parallel and adjacent to the first grooves to form a plurality of second grooves separating the amorphous silicon film into a plurality of photovoltaic strips; performing a laser isolation step of forming inter-module grooves extending through the overlying front contact strips and photovoltaic strips with a laser to separate the overlying strips into a plurality of electrically isolated front contacts and photovoltaic elements for multi-cell photovoltaic modules without damaging the substrate; forming a film of metal on the photovoltaic strips and in the inter-module grooves, the metal filling the second grooves to form electrical connections with the front contact strips; chemically etching the metal film to remove the metal from the inter-module grooves and to form a plurality of third grooves in the metal film parallel and adjacent to the second grooves, the third grooves separating the metal film overlying each module into a plurality of back contacts; covering the back contacts and third grooves with an etch resist while leaving the inter-module grooves exposed; and etching the inter-module grooves with a plasma to remove amorphous silicon recrystallized on the walls of the inter-module grooves during the laser isolation step.

The accompanying drawings, which are incorporated in and which constitute a part of this specification, illustrate one embodiment of the invention and, together with the description, explain the principles of the invention.

DESCRIPTION OF THE PREFERRED EMBODIMENT

Reference now will be made in detail to a presently preferred embodiment of the invention, an example of which is illustrated in the accompanying drawings.

Figure 1:
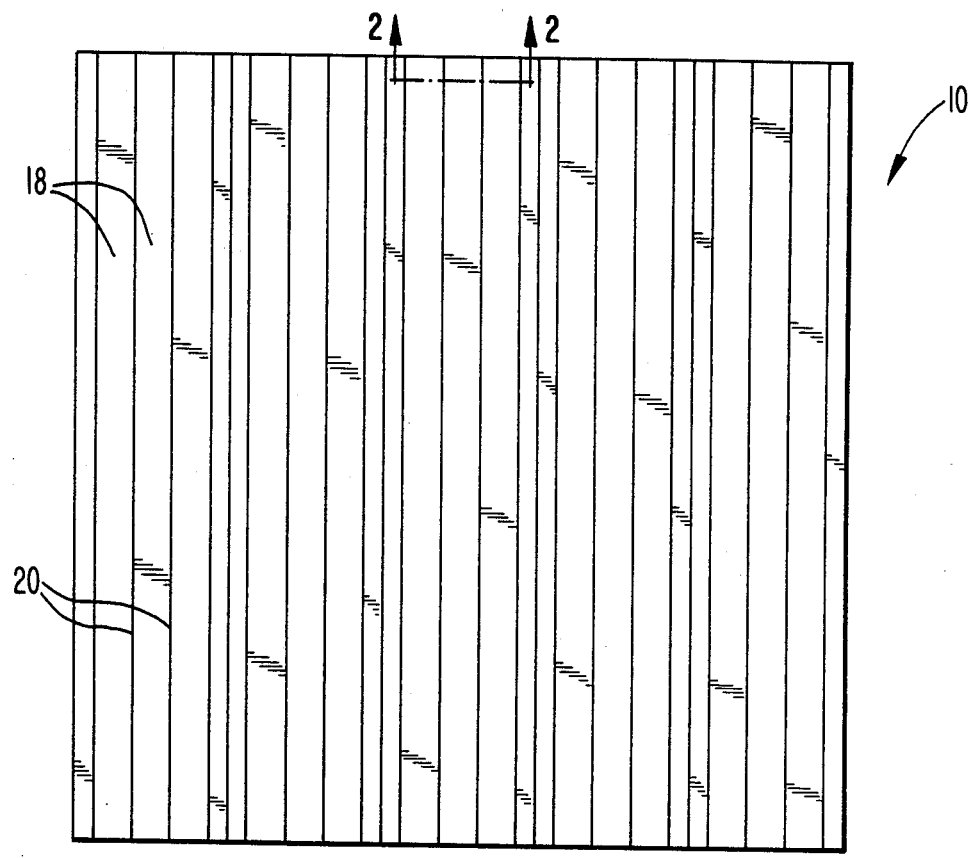
FIG. 1 is a top plan view of an array of photovoltaic modules formed on a transparent substrate prior to fabrication of the back contacts and prior to electrical isolation of adjacent modules.
Figure 2:
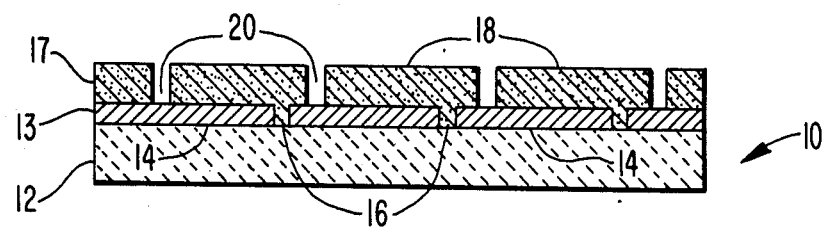
FIG. 2 is an enlarged schematic sectional view taken along line 2—2 of FIG. 1.

FIGS. 1 and 2 show an array of series-connected, multi-cell photovoltaic modules used, for example, in solar-powered calculators and fabricated according to the method of the present invention. The array, designated generally by reference numeral 10, is shown in FIGS. 1 and 2 in a state prior to fabrication of the back contacts and prior to electrical isolation of adjacent modules. Array 10 is formed on a rectangular flat substrate 12 made of glass or other conventional material transparent to solar radiation. Substrate 12 provides a substantially rigid base for the production of the photovoltaic modules and provides physical support for the modules during testing.

In accordance with the method of the present invention, a substantially continuous thin film 13 of transparent conductive oxide material, preferably fluorinated tin oxide, is formed on substrate 12 in a manner well known in the art. The thickness of transparent conductive oxide film 13 will vary depending upon the desired application of the photovoltaic modules. For example, the conductive oxide film of low-light-level modules (such as those used in solar-powered calculators), which typically are tested with light intensities less than about 1 mW/cm$^2$, preferably has a thickness of approximately 1700 Å, while highlight-level modules, or "power modules," preferably have a conductive oxide film thickness of approximately 5000 Å or greater. Power modules are tested at light intensities greater than about 1 mW/cm$^2$, typically at approximately 100 mW/cm$^2$.

Conductive oxide film 13 then is scribed in a conventional manner, preferably with a laser, to form parallel first grooves 16 dividing the conductive oxide film into parallel front contact strips 14. U.S. Pat. No. 4,292,092, the disclosure of which is incorporated herein by reference to the extent necessary to achieve a thorough understanding of the background of the invention, discloses one suitable laser scribing technique, although certainly not the only suitable technique. Scribing can be performed either by moving the laser beam with respect to the substrate or, preferably, by mounting the substrate on an X-Y table that is movable with respect to the laser beam. Preferably, scribing is done from the front (through substrate 12), although it also can be performed from the back (directly on conductive oxide film 13).

A substantially continuous thin film 17 of photovoltaic semiconductor material then is fabricated over front contact strips 14 in a conventional manner. As shown in FIG. 2, the semiconductor material of photovoltaic film 17 fills first grooves 16 and provides electrical insulation between adjacent front contact strips 14. Preferably, photovoltaic region 17 is made of hydrogenated amorphous silicon in a PIN structure and is approximately 6,000 Å in thickness, being comprised of a p-layer of 120 Å, and i-layer of 5200–5500 Å, and an n-layer of 500 Å. Deposition preferably is by glow discharge in silane, for example, by the method taught by U.S. Pat. No. 4,064,521, the disclosure of which is incorporated herein by reference to the extent necessary to achieve a thorough understanding of the background of the invention. Glow discharge can be either DC or RF powered.

Photovoltaic film 17 then is scribed, preferably by laser scribing, to form second grooves 20 separating adjacent photovoltaic strips 18. Scribing can be performed with the same laser used to scribe the transparent conductive oxide film, except that the power is reduced. The photovoltaic film also can be scribed from either side of substrate 12 but preferably is scribed from the front side. Second grooves 20 are scribed adjacent and parallel to first grooves 16 so that photovoltaic strips 18 are parallel to underlying front contact strips 14.

Figure 3:
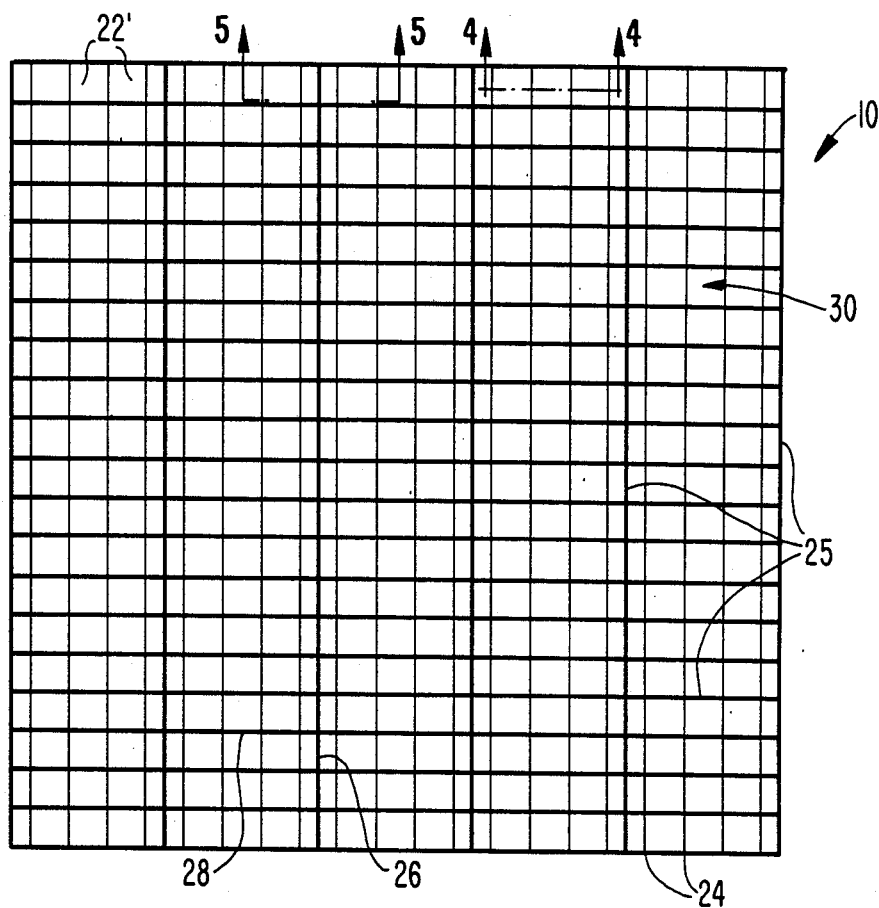
FIG. 3 is a top plan view of the array of FIG. 1 after fabrication of the back contacts and after electrical isolation of the modules in accordance with the present invention.
Figure 4:
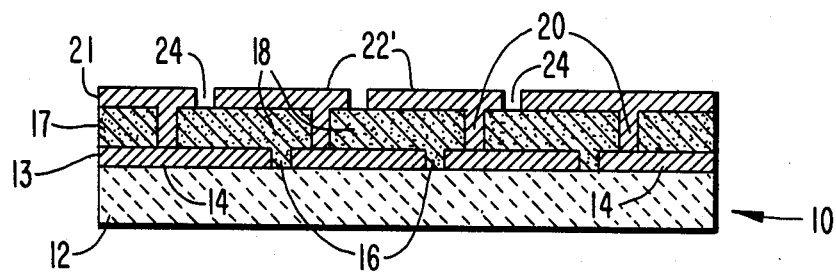
FIG. 4 is an enlarged schematic sectional view taken along line 4—4 of FIG. 3.

With reference to FIGS. 3 and 4, in one embodiment of the present invention a substantially continuous film 21 of conductive material, preferably aluminum, next is formed on top of photovoltaic strips 18. As shown in FIG. 4, the conductive material of film 21 fills second grooves 20, forming electrical connections with underlying front contact strips 14. Third grooves 24 then are formed in conductive material film 21 parallel and adjacent to second grooves 20 to separate the conductive material film into parallel back contact strips 22. Third grooves 24 are formed by chemical etching in a manner well known in the art or by laser scribing. Preferably, chemical etching is used to form third grooves 24, and film 21 also is etched to form a network of fourth grooves 25 that separate the back contacts 22' of adjacent modules (see FIG. 5 also). Fourth grooves 25 typically are approximately 750 micrometers in width and correspond in location to the inter-module grooves to be formed subsequently in the laser isolation step discussed below. Fourth grooves 25 are represented by bold lines in FIG. 3 to distinguish them from typically narrower third grooves 24, which are represented by normal lines.

Figure 5:
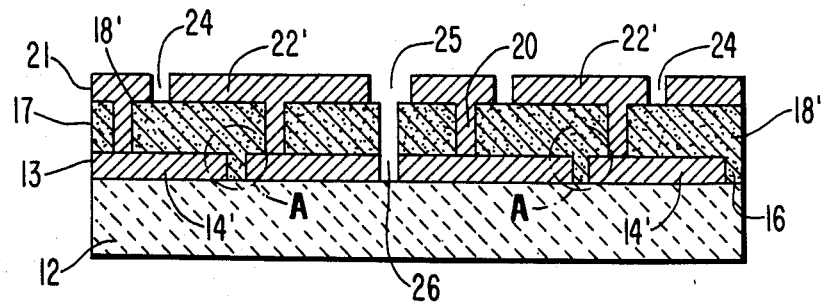
FIG. 5 is an enlarged schematic sectional view taken along line 5—5 of FIG. 3 showing portions of modules exposed along the walls of inter-module grooves formed during electrical isolation.

In accordance with the invention and with reference to FIG. 3, a laser isolation step then is performed to form inter-module grooves 26, 28 extending through front contact strips 14 and photovoltaic strips 18 without extending into substrate 12 or otherwise damaging the substrate. Inter-module grooves 26, 28 separate array 10 into a plurality of discrete photovoltaic modules electrically isolated from each other. For calculator modules, typically between 30 and 120 modules are formed on a single substrate. FIG. 3 shows an array of 100 modules formed on substrate 12. As seen in FIG. 3, the laser isolation step forms inter-module grooves 26 parallel to grooves 16, 20, 24 and intermodule grooves 28 orthogonal to grooves 26. As seen in FIGS. 3 and 5, inter-module grooves 26, 28 are laser scribed along previously etched fourth grooves 25 in back contact film 21. Typically, and as shown in FIG. 3, inter-module grooves 26 separate array 10 into five multi-cell segments. Inter-module grooves 28 divide each segment into a plurality (twenty in the array shown in FIG. 3) of individual photovoltaic modules 30, each of which comprises a plurality (three in FIG. 3) of series-connected photovoltaic cells. Each cell includes front contact 14′, photovoltaic element 18′, and back contact 22′. The series connection between adjacent cells in an individual module is accomplished by the conductive material filling second grooves 20, which connects an individual back contact 22′ with the underlying front contact 14′ of the adjacent cell.

The laser isolation step can be performed from either side of array 10 but preferably is performed from the front side of array 10, that is, through substrate 12. A frequency-doubled neodymium YAG laser emitting light having a wavelength of about 0.53 micrometers in a TEM$_{00}$ mode typically is used to form the inter-module grooves 26, 28. With low-light-level modules, the laser preferably is focused to less than about 25 micrometers with a depth of field of approximately 500 micrometers and preferably is operated at a power of approximately 100–300 mW with a pulse repetition rate of about 5 kHz and a table feed rate of about 2–10 centimeters per second. Under such scribing conditions, the width of inter-module grooves 26, 28 typically is approximately 25–50 micrometers. When high-light-level modules having thicker front contact strips are laser scribed, of course, a higher power range generally must be used.

An electrical resistance of 10–20 megohms between adjacent modules 30 is achievable through the laser isolation step performed under the presently preferred scribing conditions. Such a high inter-module resistance ensures that each module on a substrate is electrically isolated from the other modules on the same substrate during testing and curing. Typically, a minimum inter-module resistance of 1 megohm is required for adequate isolation of low-light-level modules, such as those used in solar-powered calculators, to assure that each module reacts individually when the array is illuminated during testing. Highlight-level modules, such as power modules, typically can be reliably tested with an inter-module resistance less than 1 megohm.

In a second embodiment of the method of the present invention, the laser isolation step can be performed prior to forming conductive material film 21. This embodiment has the advantage of conserving production time where third grooves 24 are formed by chemical etching, because inter-module grooves 26, 28 can be laser scribed in conjunction with the laser scribing of second grooves 20 at the same scribing station. After the laser isolation step, which forms inter module grooves 26, 28 extending through front contact strips 14 and photovoltaic strips 18 to form front contacts 14′ and photovoltaic elements 18′, back contacts 22′ are formed, preferably by conventional silkscreen methods. Typically, a film 21 of conductive material is formed on top of photovoltaic elements 18 and in second grooves 20 and inter-module grooves 26, 28. Then, a resist material is patterned on top of film 21 leaving the portions overlying intermodule grooves 26, 28 and to-be-formed third grooves 24 exposed. The exposed portions then are etched with an acid to form third grooves 24 and fourth grooves 25 in film 21 and to remove the conductive material from inter-module grooves 26, 28.

We have discovered that, when the laser isolation step is performed (either before or after fabrication of back contacts 22′) on an array of photovoltaic modules having photovoltaic elements 18′ of amorphous silicon, the amorphous silicon portions that fill first grooves 16 between adjacent front contacts 14′ of an individual module and that are exposed by inter-module grooves 28 occasionally recrystallize or form alloys with nearby conductive elements during laser scribing of grooves 28 to produce undesirable electrical contacts between adjacent front contacts 14′. These electrical contacts or "shunts" interfere with the performance of the individual photovoltaic modules 30 and decrease the percentage of the modules 30 of array 10 that meet prescribed performance criteria. FIG. 5 is an enlarged view of a section of one wall of an inter-module groove 28. The undesirable electrical contacts typically occur in the areas designated by circles A in FIG. 5. Recrystallization of exposed amorphous silicon outside of circle A also can cause problems if it acts to electrically connect, by a more circuitous route, adjacent front contacts 14′. The degree of shunting varies with the conditions present during the deposition of the amorphous silicon film and has been particularly evident during higher throughput production of modules, when deposition conditions are more difficult to control. Also, the problem is more severe with low-light level (and consequently lower-current) modules such as those used in solar-powered calculators.

For modules that are prone to exhibit such inter-cell shunting as a result of the laser isolation step, we have found that substantial improvements in the yield (the percentage of modules on an array surpassing the minimum performance criteria) of tested arrays can be achieved by an additional etching step that removes the recrystallized or alloyed silicon from the exposed walls of grooves 28. Such etching can be performed by mechanical means, chemical etching, or plasma etching. Plasma etching presently is preferable.

Plasma etching of array 10 is performed in a conventional manner. First, a resist material (not shown) is formed on the back surfaces of individual modules 30 by, for example, silk-screening to mask them while grooves 26, 28 remain exposed. (Although, ideally, only grooves 28 need to be etched, grooves 26 preferably remain exposed to the plasma to eliminate the need for removing the resist material from grooves 26 prior to breaking up the substrate. Resist material spanning grooves 26 would be cosmetically undesirable and would interfere with substrate breakup.) Then, array 10 is exposed in a conventional manner in a vacuum chamber to a plasma (an electrically ionized gas) that selectively reacts with the semiconductor material exposed in grooves 26, 28 for a prescribed period of time. Of course, the exposure time should be sufficiently long to enable the plasma to remove the recrystallized silicon exposed on the walls of grooves 28 without excessively undercutting the exposed amorphous silicon elements and without damaging the substrate, which is comprised of glass. The plasma and reactant products then are removed from the vacuum chamber by conventional means.

We have found that plasma etching using a mixture of carbon tetrafluoride and oxygen produces substantial increases in yield for low-light-level photovoltaic modules when compared to the same type of modules isolated by laser scribing alone. Many other commercially available gases effective for etching silicon materials, such as fluoroform, hexafluoroethane, chlorotrifluoromethane, sulphur hexafluoride, nitrogen trifluoride, other gases, and mixtures of these gases, also can be used. The optimum plasma etching conditions vary with the plasma constituents, the size of the chamber, the number of modules being etched at one time, and the methods used to form the modules.

When etching one substrate at a time in a small plasma chamber, we have found a carbon tetrafluoride-oxygen mixture in a ratio of 96:4 at a pressure of 26–47 Pa to provide suitable plasma etching. Under such conditions, an RF-powered ionizer preferably is operated at 200 W and the laser-isolated array preferably is exposed to the resulting plasma for a period of 30–60 seconds.

In a larger plasma chamber, such as one capable of accommodating about twenty laser-isolated arrays at a time, a carbon tetrafluoride-oxygen mixture in a ratio of 92:8 at a pressure of 26–47 Pa preferably is used in an RF-powered plasma chamber operated at 2,000 W. Under such plasma etching conditions, the plurality of arrays preferably are exposed to the plasma for approximately 4.5 minutes.

Any etch resist suitable for the plasma employed can be used to mask the individual modules from the plasma etch. We have found epoxy to be particularly suitable as a plasma etch resist when used with a carbon tetrafluoride-oxygen plasma, although other resists can be used. For many applications, the epoxy resist need not be removed after plasma etching, because it serves to protect the back contacts of the modules during testing of the array and in the end use of the individual module.

The efficacy of the plasma etch is illustrated further by the following example comparing the performance of low-light-level photovoltaic modules that were electrically isolated by laser scribing before and after being subjected to plasma etching.

Forty arrays of calculator modules were fabricated as described above using three different fabrication apparatus so that the particular apparatus used to form elements on the substrate would not affect the test results. Each array was subjected to a laser isolation step before the back contact film was deposited, as described above, using a frequency-doubled neodymium YAG laser emitting light of a wavelength of 0.53 micrometers in a TEM$_{00}$ mode focused at less than 25 micrometers with a depth of field of approximately 500 micrometers. The laser was operated at a power of 240–300 mW with a pulse repetition rate of about 5 kHz and a table feed rate (the speed at which the X-Y table was moved) of approximately 5 centimeters per second to form the inter-module grooves.

After the back contacts were formed, the forty arrays of photovoltaic modules were placed on a light test apparatus having a fluorescent light source with an intensity of 200 lux. Each individual module was tested to determine whether it produced both the minimum acceptable operating voltage of 1.5 volts and minimum acceptable operating current of 6 micro amps. "Yields" were determined by dividing the number of modules in each array exceeding both the minimum operating voltage and minimum operating current when exposed to 200 lux of illumination by the number of modules in the array and multiplying by 100 to obtain the passing percentage. The arrays then were placed twenty at a time in an RF-powered plasma chamber and exposed for approximately 4.5 minutes to a plasma formed from a mixture of carbon tetrafluoride and oxygen in a ratio of 92:8. The plasma chamber was operated at approximately 2000 W, and the gas pressure was approximately 33 Pa.

After plasma etching, the arrays were retested under the same conditions as before the plasma etching step. Table I sets forth the results of the comparison tests. Each "lot" represents ten arrays, and the reported yields are the aggregate yields for each group of ten arrays. The yields obtained after the plasma etch were consistently higher than the yields available before the plasma etch. For each lot tested, an additional 18–23% improvement in yield was obtained. This improvement occurred despite the differences in the fabrication apparatus from which the tested arrays were taken, the letters L, N, and P in the lot numbers indicating the apparatus used to produce the arrays.

TABLE I

| Array Lot No. | Yield Before Plasma Etch | Yield After Plasma Etch | Improvement in % Yield |
|---|---|---|---|
| L-05245-1 | 35% | 56% | 21 |
| L-05285-1 | 29% | 52% | 23 |
| N-05285-1 | 75% | 93% | 18 |
| P-05285-1 | 32% | 53% | 21 |

It will be apparent to those skilled in the art that modifications and variations can be made in the method of this invention without departing from the scope of the invention. For example, laser scribing can be performed at wavelengths other than those disclosed in the present application, and different plasmas and resists can be used in etching the inter-module grooves after laser isolation. Also, methods other than plasma etching, such as mechanical etching or chemical etching (using, for example, an NaOH solution), can be used in place of plasma etching. The method also can be performed on other thin-film semiconductor devices fabricated in an array on a substrate, and can be used with devices comprised of semi-crystalline or crystalline semiconductor films. Although the method has been described primarily with reference to low-light-level modules, it is equally applicable to high-light-level modules. The invention in its broader aspects is, therefore, not limited to the specific details and illustrated examples shown and described. Accordingly, it is intended that the present invention cover such modifications and variations provided that they fall within the scope of the appended claims and their equivalents.

What is claimed is:

1. A method of fabricating electrically isolated multi-cell photovoltaic modules arrayed on a transparent substrate, comprising the steps of:
    a. forming a film of transparent conductive oxide on said substrate;
    b. scribing said conductive oxide film with a laser to form a plurality of first grooves separating said conductive oxide film into a plurality of front contact strips;
    c. forming a film of photovoltaic semiconductor material on said front contact strips, said semiconductor material filling said first grooves to electrically insulate adjacent front contact strips;

d. scribing said semiconductor film with a laser parallel and adjacent to said first grooves to form a plurality of second grooves separating said semiconductor film into a plurality of photovoltaic strips;

e. forming a film of conductive material on said photovoltaic strips, said conductive material filling said second grooves to form electrical connections with said front contact strips;

f. forming a plurality of third grooves in said conductive material film, said third grooves being parallel and adjacent to said second grooves and separating said conductive material film into a plurality of back contact strips;

g. performing a laser isolation step of forming inter-module grooves extending through said overlying front contact, photovoltaic, and back contact strips with a laser to separate said overlying strips into a plurality of electrically isolated multi-cell photovoltaic modules without damaging said substrate; and h. etching said semiconductor material exposed on the walls of said inter-module grooves after said laser isolation step.

2. The method of claim 1, further including the step of chemically etching said back contact strips before said laser isolation step to form back contact grooves separating back contacts of adjacent photovoltaic modules, and wherein said laser isolation step forms said inter-module grooves within said back contact grooves.

3. A method of fabricating electrically isolated multi-cell photovoltaic modules arrayed on a transparent substrate, comprising the steps of:

a. forming a film of transparent conductive oxide on said substrate;

b. scribing said conductive oxide film with a laser to form a plurality of first grooves separating said conductive oxide film into a plurality of front contact strips;

c. forming a film of photovoltaic semiconductor material on said front contact oxide strips, said semiconductor material filling said first grooves to electrically insulate adjacent front contact strips;

d. scribing said semiconductor film with a laser parallel and adjacent to said first grooves to form a plurality of second grooves separating said semiconductor film into a plurality of photovoltaic strips;

e. performing a laser isolation step of forming inter-module grooves extending through said overlying front contact strips and photovoltaic strips with a laser to separate said overlying strips into a plurality of electrically isolated front contacts and photovoltaic elements for multi-cell photovoltaic modules without damaging said substrate;

f. fabricating back contacts of conductive material on said photovoltaic elements to form multi-cell photovoltaic modules, said conductive material filling said second grooves to form electrical connections with said front contacts; and g. etching said photovoltaic semiconductor material exposed on the walls of said inter-module grooves after said laser isolation step.

4. The method of claim 3, wherein said etching step includes covering said photovoltaic modules with an etch resist while leaving said inter-module grooves exposed and etching said inter-module grooves with a plasma.

5. The method of claim 4, wherein said etch resist is epoxy.

6. The method of claim 4, wherein said plasma comprises a mixture of carbon tetrafluoride and oxygen.

7. The method of claim 3, wherein:

said laser isolation step includes forming a first set of inter-module grooves parallel to said first and second grooves and a second set of inter-module grooves perpendicular to said first and second grooves, the walls of said second set of intermodule grooves including exposed semiconductor portions filling said first grooves; and said etching step includes etching at least said exposed semiconductor portions in said first grooves lining said walls of said second set of inter-module grooves.

8. A method of fabricating electrically isolated multi-cell photovoltaic modules arrayed on a transparent substrate, comprising the steps of:

a. forming a film of transparent conductive oxide on said substrate;

b. scribing said conductive oxide film with a laser to form a plurality of first grooves separating said conductive oxide film into a plurality of front contact strips;

c. fabricating a film of photovoltaic amorphous silicon on said conductive oxide strips, said amorphous silicon filling said first grooves to electrically insulate adjacent front contact strips;

d. scribing said amorphous silicon film with a laser parallel and adjacent to said first grooves to form a plurality of second grooves separating said amorphous silicon film into a plurality of photovoltaic strips;

e. performing a laser isolation step of forming inter-module grooves extending through said overlying front contact strips and photovoltaic strips with a laser to separate said overlying strips into a plurality of electrically isolated front contacts and photovoltaic elements for multi-cell photovoltaic modules without damaging said substrate;

f. forming a film of metal on said photovoltaic elements and in said inter-module grooves, said metal filling said second grooves to form electrical connections with said front contact strips;

g. chemically etching said metal film to remove said metal from said inter-module grooves and to form a plurality of third grooves in said metal film parallel and adjacent to said second grooves, said third grooves separating said metal film overlying each module into a plurality of back contacts; and h. etching said inter-module grooves to remove amorphous silicon recrystallized on the walls of said inter-module grooves during said laser isolation step.

9. The method of claim 8, wherein said amorphous silicon etching step includes covering said back contacts and third grooves with an etch resist while leaving said inter-module grooves exposed and etching said inter-module grooves with a plasma.

10. The method of claim 9, wherein said etch resist is epoxy.

11. The method of claim 9, wherein said plasma comprises a mixture of carbon tetrafluoride and oxygen.

12. The method of claim 11, wherein said mixture of carbon tetrafluoride and oxygen is in a ratio of 96:4.

13. The method of claim 11, wherein said mixture of carbon tetrafluoride and oxygen is in a ratio of 92:8.

14. A method of removing recrystallized semiconductor material from the walls of laser-scribed grooves separating adjacent thin-film semiconductor devices formed in an array on a substrate, comprising the steps of:
   covering said array with an etch resist while leaving said grooves exposed; and
   etching said grooves with a plasma in a plasma chamber, said plasma reacting with and removing said recrystallized semiconductor material on said groove walls.

15. The method of claim 14, wherein said etch resist is epoxy.

16. The method of claim 14, wherein said plasma comprises a mixture of carbon tetrafluoride and oxygen.

17. The method of claim 16, wherein said mixture of carbon tetrafluoride and oxygen is in a ratio of 96:4.

18. The method of claim 17, wherein said plasma chamber holds only one of said arrays, said plasma chamber is operated at approximately 200 W, and said one array is exposed to said plasma for about 30–60 seconds.

19. The method of claim 16, wherein said mixture of carbon tetrafluoride and oxygen is in a ratio of 98:2.

20. The method of claim 19, wherein said plasma chamber holds approximately twenty of said arrays, said plasma chamber is operated at approximately 2000 W, and said arrays are exposed to said plasma for about 4–5 minutes.

21. An array of electrically isolated, thin-film semiconductor devices fabricated on a single substrate, wherein said semiconductor devices are separated by laser-scribed grooves extending through to said substrate and wherein the walls of said grooves have been etched by plasma etching.

* * * * *